(12) United States Patent
Yin et al.

(10) Patent No.: US 12,388,430 B1
(45) Date of Patent: Aug. 12, 2025

(54) PROGRAMMABLE DELAY-LINE CIRCUIT WITH SINGLE DELAY ARRAY AND REAL-TIME CALIBRATION

(71) Applicant: QUALCOMM Incorporated, San Diego, CA (US)

(72) Inventors: Wenjing Yin, San Diego, CA (US); Xu Zhang, San Diego, CA (US); Qingjin Du, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 53 days.

(21) Appl. No.: 18/440,726

(22) Filed: Feb. 13, 2024

(51) Int. Cl.
| | |
|---|---|
| *H03K 5/133* | (2014.01) |
| *H03K 3/03* | (2006.01) |
| *H03K 5/14* | (2014.01) |
| *H03K 5/00* | (2006.01) |
| *H03K 19/20* | (2006.01) |

(52) U.S. Cl.
CPC ............ *H03K 5/14* (2013.01); *H03K 3/0315* (2013.01); *H03K 2005/00019* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 6,642,801 B1 * | 11/2003 | Zortea | H03K 5/133 455/260 |
| 10,520,901 B2 | 12/2019 | Wu et al. | |
| 10,587,253 B1 | 3/2020 | Huang et al. | |
| 11,533,058 B2 * | 12/2022 | Wu | H03K 19/20 |
| 11,996,849 B2 * | 5/2024 | Jouanneau | H03K 5/15093 |

FOREIGN PATENT DOCUMENTS

WO    2017052876 A1    3/2017

OTHER PUBLICATIONS

International Search Report and Written Opinion—PCT/US2025/012151—ISA/EPO—May 14, 2025.

* cited by examiner

*Primary Examiner* — Jeffrey S Zweizig
(74) *Attorney, Agent, or Firm* — Loza & Loza, LLP

(57) ABSTRACT

A programmable delay-line circuit is provided that includes a single ring oscillator that is calibrated continuously by a calibration logic circuit. A clock edge sampler samples an input clock responsive to a plurality of oscillator output signals from the ring oscillator to form a corresponding plurality of data output signals. A clock edge voter processes the data output signals to identify a first one of the oscillator output signals that samples an edge transition of the input clock. Based upon a desired delay, a decoder selects for a second one of the oscillator output signals to produce an output clock signal.

20 Claims, 6 Drawing Sheets

| INPUT | | | OUTPUT |
|---|---|---|---|
| A | B | C | (A, B, C) |
| 0 | 0 | 0 | 0 |
| 0 | 0 | 1 | 0 |
| 0 | 1 | 0 | 0 |
| 1 | 0 | 0 | 0 |
| 0 | 1 | 1 | 1 |
| 1 | 0 | 1 | 1 |
| 1 | 1 | 0 | 1 |
| 1 | 1 | 1 | 1 |

PROGRAMMABLE DELAY-LINE CIRCUIT WITH SINGLE DELAY ARRAY AND REAL-TIME CALIBRATION

TECHNICAL FIELD

The present application relates generally to delay-line circuits, and more specifically to a programmable delay-line circuit with a single delay array and real-time calibration.

BACKGROUND

Programmable delay-line circuits have a wide variety of applications. For example, a dynamic random-access memory (DRAM) controller will typically include a programmable delay-line circuit. By adjusting the delay from the programmable delay-line circuit, the DRAM controller may delay a data strobe with respect to a memory clock signal so as to position the data strobe in the center of the data eye. A programmable delay-line circuit is also used within delay-locked loop circuits. Although programmable delay-line circuits are thus quite useful, they are subject to process, voltage, and temperature variations that affect their accuracy.

SUMMARY

In accordance with an aspect of the disclosure, a delay-line circuit for delaying an input clock signal is provided that includes: a ring oscillator including a plurality of delay cells, the ring oscillator configured to produce oscillator output signals; a clock edge sampler configured to generate data output signals, the clock edge sampler including a plurality of flip-flops corresponding to the plurality of delay cells on a one-to-one basis, each flip-flop being configured to latch the input clock signal responsive to an oscillator output signal from a corresponding delay cell to produce a corresponding data output signal; and a delay output decoder configured to process the data output signals to select a first one of the oscillator output signals to form an output clock signal.

In accordance with another aspect of the disclosure, a method is provided that includes: generating a corresponding oscillator output signal in each delay cell in a plurality of delay cells arranged to form a ring oscillator; sampling an input clock signal responsive to each oscillator output signal to form a plurality of data output signals; processing the data output signals to identify a first one of the oscillator output signals as sampling an edge transition of the input clock signal; and outputting a second one of the oscillator output signals as an output clock signal.

Finally, in accordance with yet another aspect of the disclosure, a delay-line circuit is provided that includes: a single ring oscillator configured to produce a plurality of oscillator output signals; a clock edge sampler configured to sample an input clock signal according to the plurality of oscillator output signals to provide a plurality of data output signals; and a decoder configured to select one of the oscillator output signals as an output clock signal responsive to a processing of the plurality of data output signals.

These and other advantageous features may be better appreciated through the following detailed description.

BRIEF DESCRIPTION OF THE DRAWINGS

FIG. 3 is a truth table for a clock edge voter in accordance with an aspect of the disclosure.

Implementations of the present disclosure and their advantages are best understood by referring to the detailed description that follows. It should be appreciated that like reference numerals are used to identify like elements illustrated in one or more of the figures.

DETAILED DESCRIPTION

A variety of approaches have been developed to address the process, voltage, and temperature variations that affect the accuracy of a delay from a programmable delay-line circuit. In one approach, a programmable delay-line circuit may include a pair of delay arrays in a master-slave relationship. A master delay array in the pair is continually calibrated with respect to a reference clock signal. A slave delay array in the pair generates the delayed output signal within a delay-locked loop based upon a phase-locked loop (PLL) output signal from a PLL that includes the master delay array. Although the delayed output signal is thus continually calibrated, there is a static delay error between the master and slave delay arrays that cannot be calibrated out. In addition, the delayed output signal was subject to a relatively long settling time and thus hindered instantaneous delay tracking ability. The analog design of the PLL is also not easy to port from one process node to another.

In another architecture, two delay arrays alternate between a delay mode and a calibration mode such that while one of the delay arrays is in the calibration mode, the remaining delay array is in the delay mode to drive the delayed output signal. However, the switching between the two delay arrays to drive the delayed output signal causes delay uncertainty. In addition, the calibration may have a limited ability to track voltage and temperature variations.

Figure 1:
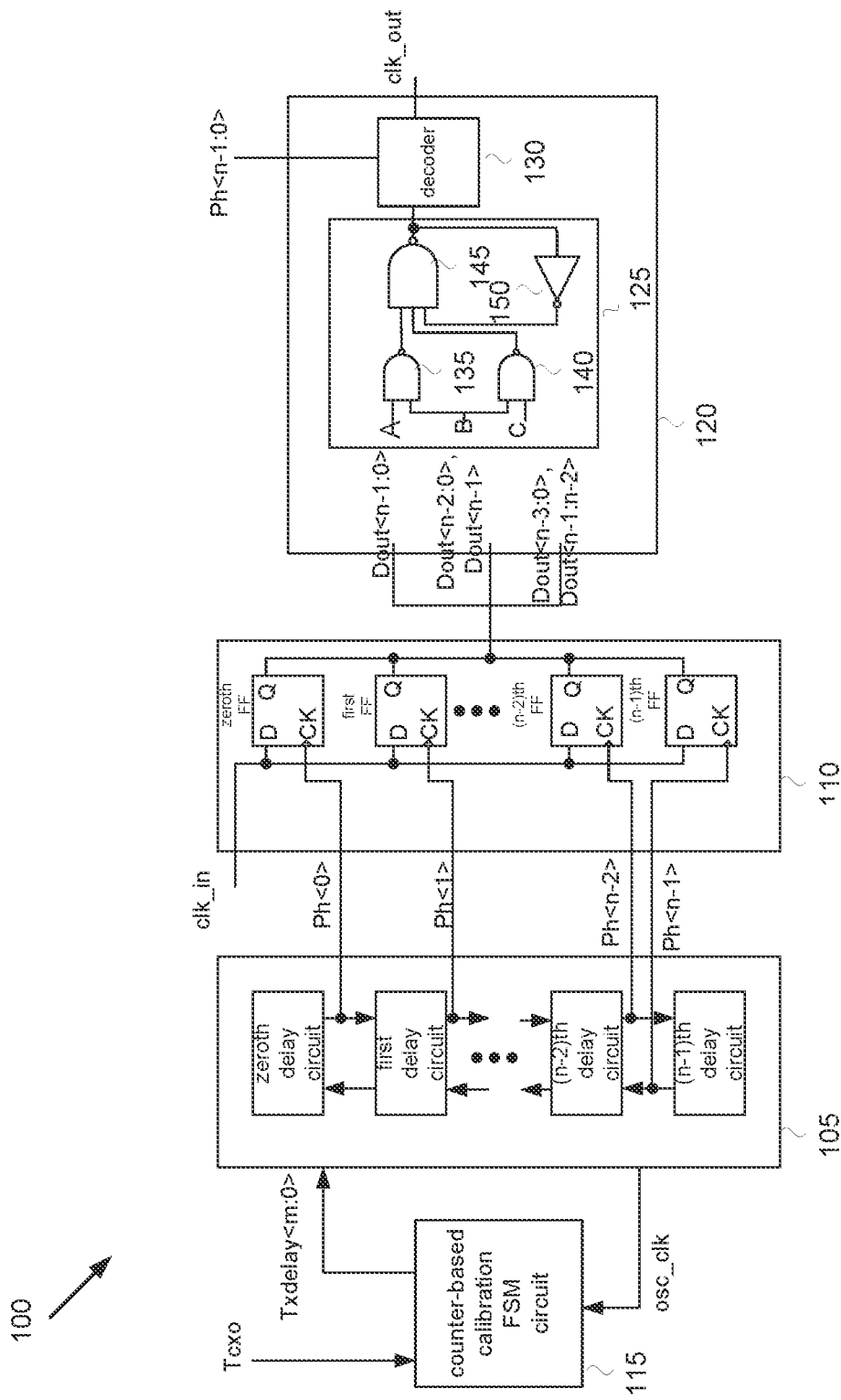
FIG. 1 illustrates a programmable delay-line circuit in accordance with an aspect of the disclosure.

A calibrated programmable delay-line circuit is provided that uses a single delay array (which is also denoted herein as a ring oscillator) and thus does not suffer from mismatches between delay arrays. In addition, the calibration is always on and thus may readily track process, voltage, and temperature variations. Moreover, the delayed output signal is available from an initial clock cycle and thus does not suffer from any extended settling time. An example programmable delay-line circuit 100 is shown in FIG. 1. A glitch-free ring oscillator 105 includes a plurality of n delay circuits (e.g., 4, 8, 16, and so on) arranged in a ring from a zeroth delay circuit to an (n−1)th delay circuit. Each delay circuit is also denoted herein as a delay unit. As known in the ring oscillator arts, each delay circuit functions to delay an output signal from a preceding delay circuit in the ring oscillator 105. For example, the zeroth delay circuit delays an output signal from the (n−1)th delay circuit to drive a delayed output signal to a first delay circuit. In turn, the first delay circuit drives a delayed output signal to a second delay circuit (not illustrated). In this fashion, each subsequent delay circuit in the ring oscillator 105 delays an output signal from the preceding delay circuit. For example, the (n−1)th delay circuit delays an output signal from an (n−2)th delay circuit.

The output signal from each delay circuit is also denoted herein as an oscillator output signal. The ring oscillator 105 thus produces a plurality of n oscillator output signals that all share the same frequency but each having a unique phase. Since each oscillator output signal has the same frequency, the oscillator output signals all have the same oscillation period. The number n of delay circuits determines a corresponding number n of oscillator clock signal phases from the ring oscillator 105. For example, the zeroth delay circuit may be deemed to produce a corresponding oscillation output signal (Ph<0>) having a clock edge transition (either a rising edge from ground to a power supply voltage or a falling edge from the power supply voltage to ground) that is synchronous with a beginning of the oscillation period. The first delay circuit would then produce a corresponding oscillation output signal (Ph<1>) that transitions at (1/n)th of the oscillation period after the beginning of the oscillation period. More generally, an ith delay circuit produces a corresponding oscillation output signal that transitions at (i/n)th of the oscillation period after the beginning of the oscillation period, where i represents the integer order of the delay circuit in the progression from 0 to n−1.

The plurality of n oscillation output signals from the n delay circuits in the ring oscillator 105 are sampled by a clock edge sampler 110 with respect to an edge transition (e.g., a rising-edge from ground to a power supply voltage) of an input clock signal (clk_in). Each oscillation output signal is sampled by a corresponding memory element such as a data (D) type flip-flop. For example, a zeroth flip-flop (FF) samples the zeroth oscillation output signal Ph<0> from the zeroth delay circuit. Similarly, a first flip-flop samples the first oscillation output signal Ph<1> from the first delay circuit. In the same fashion, an (n−2)th flip-flop samples an (n−2)th oscillation output signal Ph<n−2> from the (n−2)th delay circuit. Finally, an (n−1)th flip-flop samples an (n−1)th oscillation output signal from the (n−1)th delay circuit.

Each flip-flop of the n flip-flops in the clock edge sampler 110 receives the input clock signal at its data (D) input and is clocked by the corresponding oscillation output signal. The zeroth flip-flop will thus register the input clock signal at a rising edge of the zeroth oscillation output signal Ph<0>. A data output signal Dout<0> from the zeroth flip-flop thus captures the binary value (either 0 or 1) of the input clock signal at the rising edge of the zeroth oscillation output signal Ph<0>. Similarly, the first flip-flop registers the input clock signal at a rising edge of the first oscillation output signal Ph<1>. A data output signal Dout<1> from the first flip-flop thus captures the binary value of the input clock signal at the rising edge of the first oscillation output signal Ph<1>. The (n−2)th flip-flop registers the input clock signal at the rising edge of the (n−2)th oscillation output signal Ph<n−2>. A data output signal Dout<n−2> from the (n−2)th flip-flop thus captures the binary value of the input clock signal at the rising edge of the (n−2)th oscillation output signal Ph<n−2>. Finally, the (n−1)th flip-flop registers the input clock signal at a rising edge of the (n−1)th oscillation output signal Ph<n−1>. A data output signal Dout<n−1> from the (n−1)th flip-flop thus captures the binary value of the input clock signal at the rising edge of the (n−1)th oscillation output signal Ph<n−1>.

Following the rising edge of the input clock signal, the input clock signal will stay charged to the power supply voltage depending upon the duty cycle of the input clock signal. Depending upon the duty cycle, a corresponding number of the data output signals will have a binary one value following the rising edge of the input cock signal. However, since the clock edge sampling by the n flip-flops in the clock edge sampler 110 is asynchronous with respect to the input clock signal, it is possible that a given data output signal could have a binary one or zero value due to a glitch. A delay output decoder 120 thus includes a clock edge voter 125 that examines a trio of consecutive ones of the data output signals. For example, the clock edge voter 125 processes the zeroth data output signal Dout<0., the first data output signal Dout<1>, and a second data output signal Dout<2>. Similarly, the clock edge voter 125 processes the first data output signal Dout<1>, the second data output signal Dout<2>, and a third data output signal Dout<3>, and so on. This processing of a trio of data output signals is advantageous with respect to preventing a glitch from being interpreted as a detection of the rising edge of the input clock signal.

To process these triples of consecutive data output signals, the clock edge voter 125 receives the n data output signals Dout<n−1:0>. In addition, the clock edge voter 125 receives a one-sample delayed version of the n data output signals Dout<n−2:0>, Dout<n−1> and also receives a two-sample delayed version of the n data output signals Dout<n−3:0>, Dout<n−1:n−2>. A current data output signal from the n data output signals Dout<n−1:0> may be denoted as a B signal. Similarly, a one-sample preceding data output signal from the current data output signal may be denoted as an A signal. Finally, a one-sample delayed output signal from the current data output signal may be denoted as a C signal. The clock edge voter 125 thus processes the A, B, and C signals to decide whether the current data output signal has sampled the rising edge of the input clock signal.

In one implementation, the clock edge voter 125 may include a first logic gate such as a first NAND gate 135 that NANDS the A and B data output signals and also include a second logic gate such as a second NAND gate 140 that NANDs the B and C data output signals. A third NAND gate 145 NANDs an output signal from the NAND gate 135, an output signal from the NAND gate 140, and its inverted output signal as inverted by an inverter 150 to produce a current data vote output signal that represents a vote as to whether the current data output signal B has sampled a rising edge of the input clock signal. The clock edge voter 125 produces n votes corresponding to the n data output signals. For example, when the current data output signal is the second data output signal Dout<2>, the clock edge voter 125 also examines the first data output signal Dout<11> and a third data output signal Dout<3> to determine whether to set a binary value for a second data vote output signal D_vot<2> (not illustrated). More generally, the clock edge voter 125 examines an ith data output signal Dout<i>, an (i−1)th data output signal Dout<i−1>, and an (i+1)th data output signal Dout<i+1> to determine a binary value of an ith data vote output signal D_vot<i>, where i represents the integer order of the current data output signal in the progression from 0 to n−1.

The clock edge voter 125 sets the ith data vote output signal D_vot<i> to a binary one if the ith data output signal Dout<i> and at least one of the data output signals Dout<i−1> and Dout<i+1> also equals a binary one. Suppose that the ith data output signal Dout<i> is a binary zero only because of a clock edge sampling glitch due to the lack of synchrony between the ith oscillator output signal Ph<i> and the clock input signal and/or due to instability of the ith flip-flop. In that case, the preceding data output signal Dout<i−1> and the subsequent data output signal Dout <i+1> will both be a binary one. The clock edge voter 125 would then set the ith data vote output signal D_vot<i> to a binary one despite the glitch at the ith data output signal Dout<i>. With the rising edge of the input clock signal detected by the corresponding ith data vote output signal D_vot<i>, a decoder 130 can then select from the oscillator output signals Ph<n−1:0> according to a desired delay. For example, suppose that the desired delay equals (m/n)th of the oscillation period, where m is a positive integer less than n. The decoder 130 may then output the oscillator output signal Ph<i+m> as the delayed output clock signal.

Figure 2:
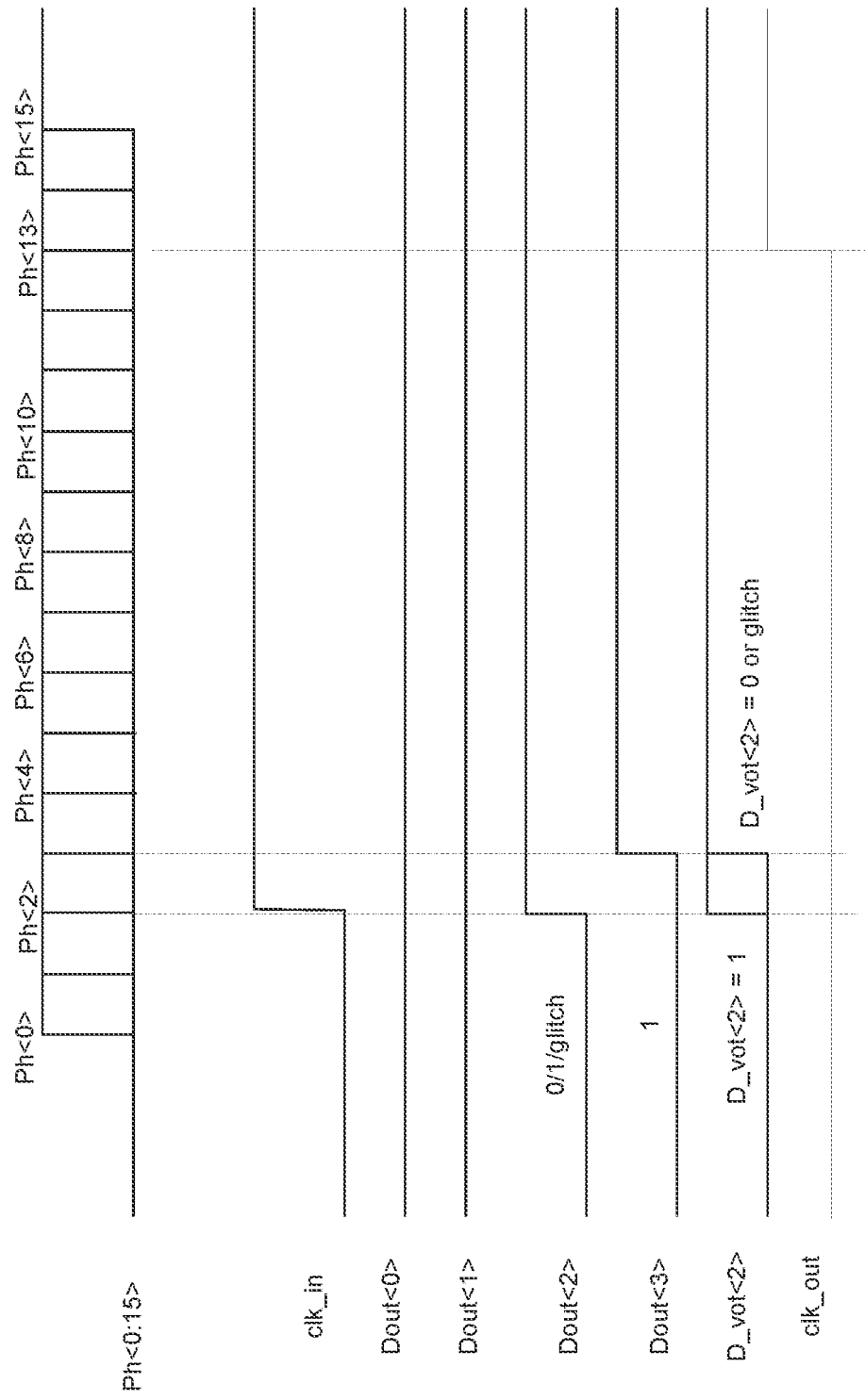
FIG. 2 is a diagram of some waveforms from a programmable delay-line circuit in accordance with an aspect of the disclosure.

Some example operating waveforms for the clock edge sampler 110 and the delay output decoder 120 are shown in FIG. 2 for an implementation in which n (the number of oscillation output signals from the ring oscillator 105) equals sixteen. The oscillation output signals thus range from a zeroth oscillation output signal Ph<0> to a fifteenth oscillation output signal Ph<15>. The clock input signal (clk_in) has a rising edge slightly before the second oscillation output signal Ph<2>. The zeroth data output signal Dout<0> and the first data output signal Dout<1> will both be binary zeroes. A first data vote output signal D_vot<1> (not illustrated) will also be a binary zero since both the first data output signal Dout<1> and its preceding data output signal Dout<0> are both binary zeroes. The second data output signal Dout<2> may be a binary zero, a binary one, or a glitch depending upon the stability of the second flip-flop. But the third data output signal Dout<3> will be a binary one as the rising edge of the third oscillation output signal Ph<3> occurs well after the rising edge of the clock input signal. Should the second data output signal Dout<2> be sampled as a binary one, the second data vote output signal D_vot<2> will be a binary one since both the second data output signal Dout<2> and the third data output signal Dout<3> are binary ones. But if the second data output signal Dout<2> is a binary zero or a glitch, the second data vote output signal D_vot<2> will be a binary zero.

An example truth table for the clock edge voter 125 is as shown in FIG. 3. The data vote output signal is denoted as "OUTPUT" whereas the binary values of the A, B, and C data output signals is denoted as "INPUT." It is only when at least two of the A, B, and C data output signals are binary ones that the OUTPUT signal is a binary one. Otherwise, the OUTPUT signal is a binary zero.

Suppose that the second data vote output signal D_vot<2> is a binary one. The decoder 130 (FIG. 1) will then select for the oscillation output signal Ph<m+2>, where m is the desired integer delay as discussed earlier. Should m equal 11, the decoder 130 would output the thirteenth oscillation output signal Ph<13> to form the delayed output clock signal (clk_out). The selected oscillation output signal to form the delayed output clock signal may also be denoted herein as a first one of the oscillation output signals.

Referring again to FIG. 1, note that the oscillation period and frequency of the ring oscillator 105 is subject to process, voltage, and temperature variations. For example, the oscillation frequency will decrease as the temperature falls, which increases the oscillation period and thus increases the delay between consecutive ones of the oscillation output signals. To calibrate out these process, voltage, and temperature variations, a calibration logic circuit such as a counter-based calibration finite-state machine (FSM) circuit 115 receives one of the oscillation output signals as an oscillator clock signal (osc_clk). The counter-based FSM circuit 115 also receives a stable clock signal such as a crystal oscillator clock signal Tcxo. The counter-based FSM circuit 115 may count according to cycles of the crystal oscillator signal to establish a count for the oscillator period or frequency of the ring oscillator 105. Should this count be too low, the counter-based FSM circuit 115 adjusts a tuning signal Txdelay<m:0> to increase the oscillation frequency of the ring oscillator 105, where the tuning signal Txdelay has a resolution of m+1 bits, m being a positive integer. Alternatively, if the count is too high, the counter-based FSM circuit 115 adjusts the tuning signal Txdelay to decrease the oscillation frequency of the counter-based FSM circuit 115.

Figure 4:
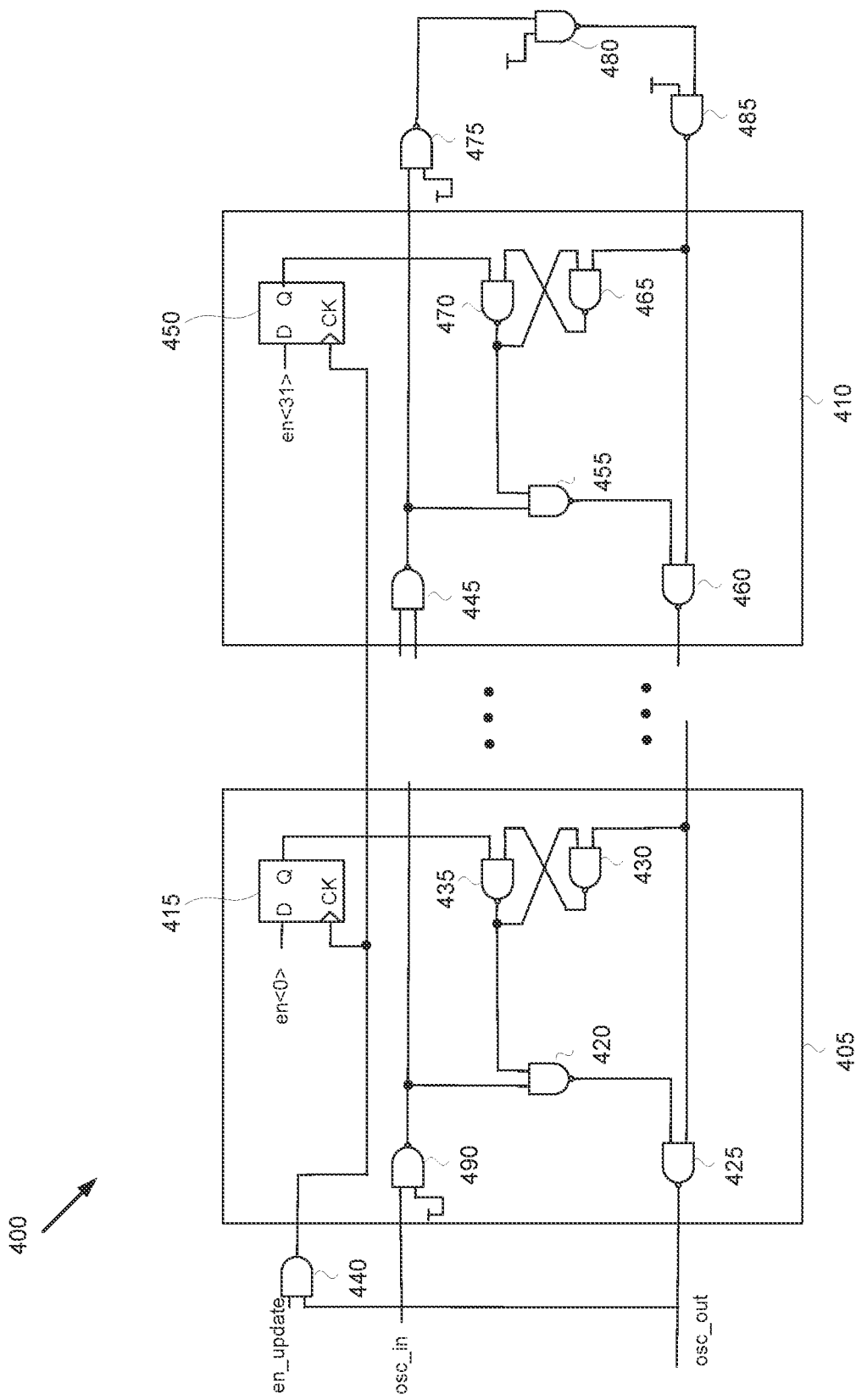
FIG. 4 illustrates an example delay circuit for the ring oscillator of the programmable delay-line circuit of FIG. 1 in accordance with an aspect of the disclosure.

To respond to tuning signal Txdelay, each delay circuit of the ring oscillator may be implemented as shown for an example delay circuit 400 of FIG. 4. The delay circuit 400 includes a plurality of delay cells arranged in series that depend upon the resolution of the tuning signal Txdelay. For example, suppose that the tuning signal Txdelay is a 5-bit tuning signal. This 5-bit tuning signal may be converted into a thirty-two-bit thermometer-encoded enable signal ranging from a zeroth enable signal en<0> that controls a zeroth delay cell 405 to a thirty-first enable signal en<31> that controls a thirty-first delay cell 410. The oscillator input signal to the zeroth delay cell 405 is received by a NAND gate 490 that also receives the power supply voltage. An output signal from the NAND gate 490 is processed by a NAND gate 420 that also NANDs an output signal from a latch formed by a cross-coupled pair of NAND gates 435 and 430. A NAND gate 425 NANDs an output signal from the NAND gate 420 with an output signal from a first delay cell (not illustrated) to form the oscillator output signal for the delay circuit 400. The NAND gate 430 also NANDs the output signal from the first delay cell. An AND gate 440 ANDs the oscillator output signal to form a clocking signal for a D-type flip-flop in each of the delay cells. For example, the first delay cell 405 includes a D-type flip-flop 415 that latches the zeroth enable signal en<0> responsive to the clocking by the oscillator output signal to drive an input of the NAND gate 435.

Depending upon the corresponding enable signal, each delay cell contributes to the delay of the oscillator output signal. For example, the thirty-first delay cell includes a D-type flip-flop 450 that latches the thirty-first enable signal en<31> when clocked by the oscillator output signal to drive an input of a NAND gate 470 that is cross-coupled with a NAND gate 465 to form a latch. A NAND gate 455 NANDs an output signal from a NAND gate 445 and the NAND gate 470. The NAND gate 455 NANDs an output signal from the thirtieth delay cell (not illustrated) and the Q output signal from the D-type flip-flop (not illustrated) in the thirtieth delay cell. A NAND gate 460 NANDs an output signal from the NAND gate 455. The output signal from the NAND gate 445 is also processed serially through three NAND gates 475, 480, and 485 that are configured as inverters to drive the NAND gate 465 and the NAND gate 460. An output signal from the NAND gate 460 is received by the equivalent of NAND gate 430 (not illustrated) in the thirtieth delay cell.

It will be appreciated that other architectures may be used to form each delay circuit in the ring oscillator 105. In that regard, the NAND gates in the delay cells of FIG. 4 may be replaced by other types of logic gates. Regardless of how the delay cells are formed, note that the programmable delay-line circuit 100 uses just one ring oscillator 105 that is advantageously continuously calibrated. There is thus no mismatch issue between delay arrays as discussed previously nor is there any settling time required.

Figure 5:
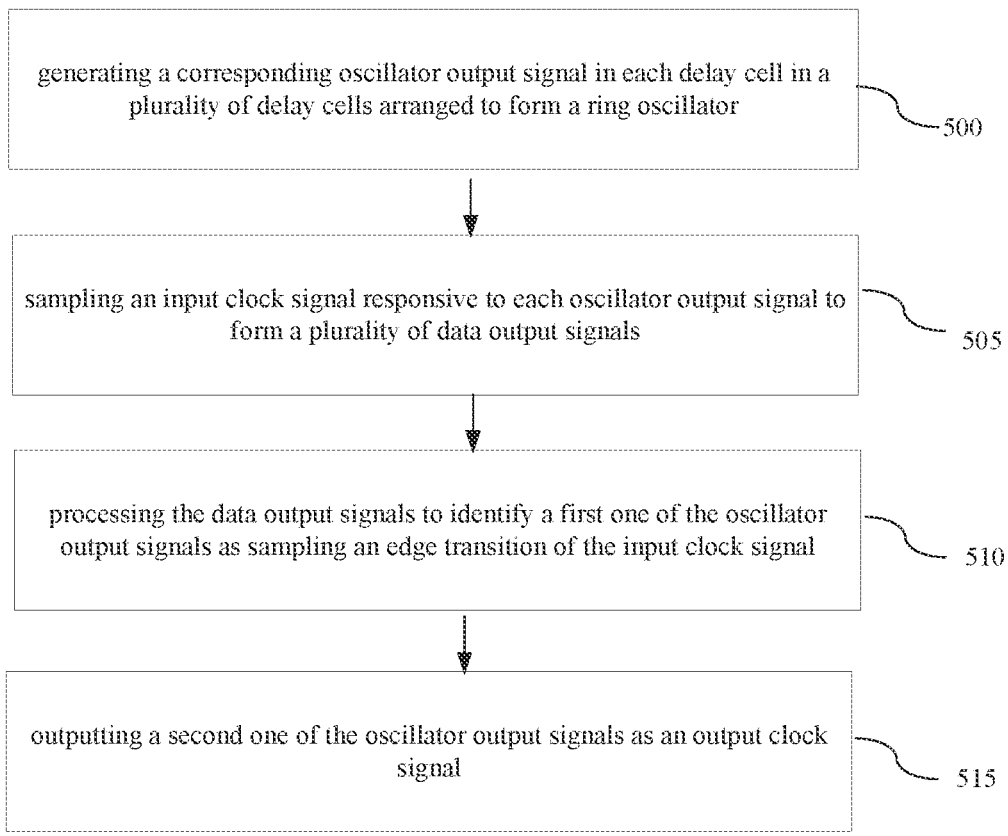
FIG. 5 is a flowchart of a method of operation for a programmable delay-line circuit in accordance with an aspect of the disclosure.

A method of operation for a programmable delay-line as disclosed herein will now be discussed with respect to the flowchart of FIG. 5. The method includes an act 500 of generating a corresponding oscillator output signal in each delay cell in a plurality of delay cells arranged to form a ring oscillator. The generation of the plurality of n oscillator output signals Ph<n–1:0> in the ring oscillator 105 is an example of act 500. The method also includes an act 505 of sampling an input clock signal responsive to each oscillator output signal to form a plurality of data output signals. The sampling of the input clock clk_in by the clock edge sampler 110 is an example of act 505. In addition, the method includes an act 510 of processing the data output signals to identify a first one of the oscillator output signals as sampling an edge transition of the input clock signal. The processing of the data output signals as discussed with regard to the clock edge voter 125 is an example of act 510. Finally, the method includes an act 515 of outputting a second one of the oscillator output signals as an output clock signal. The selection from the oscillator output signals Ph<n–1:0> as discussed with respect to the decoder 130 is an example of act 515.

Figure 6:
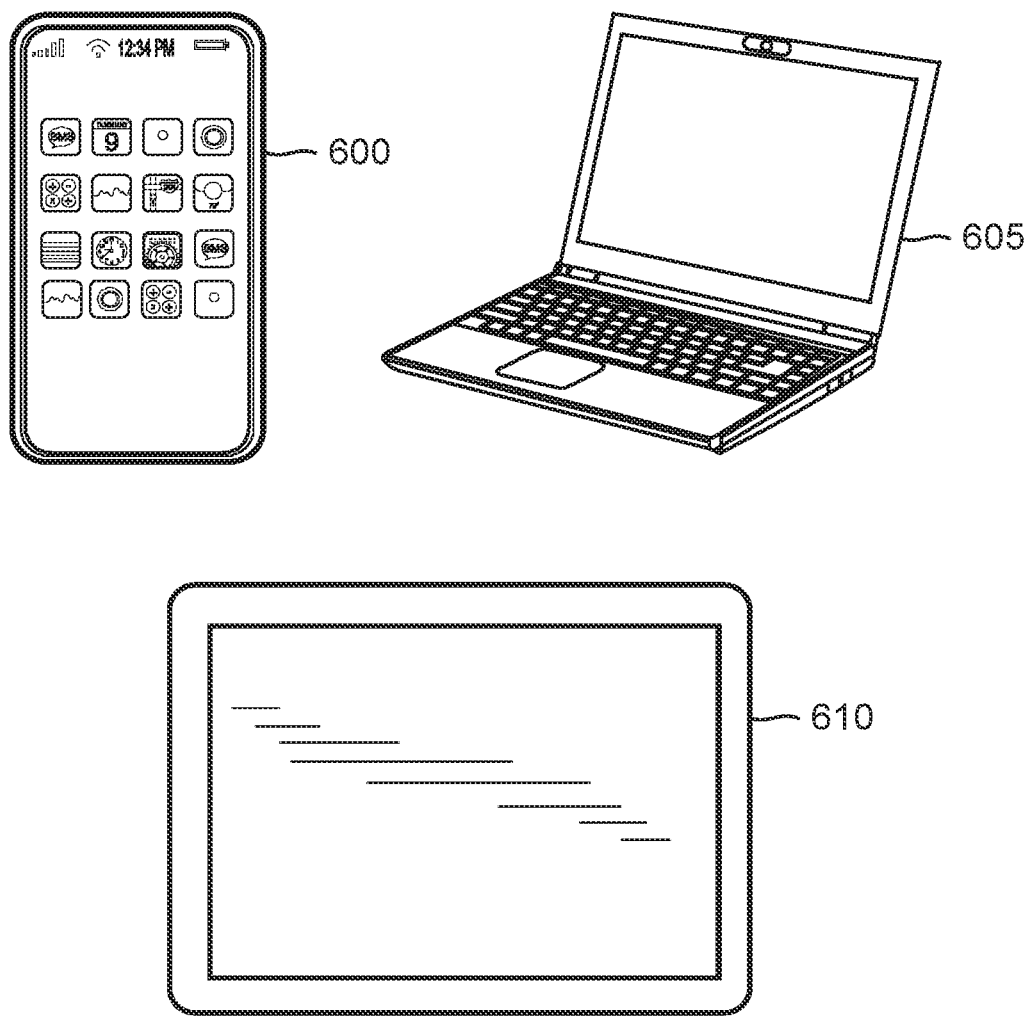
FIG. 6 illustrates some example electronic systems including a programmable delay-line circuit in accordance with an aspect of the disclosure.

A programmable delay-line circuit as disclosed herein may be incorporated in a wide variety of electronic systems. For example, as shown in FIG. 6, a cellular telephone 600, a laptop computer 605, and a tablet PC 610 may all include a programmable delay-line circuit in accordance with the disclosure. Other exemplary electronic systems such as an earbud, a music player, a video player, a communication device, and a personal computer may also be configured with a programmable delay-line circuit constructed in accordance with the disclosure.

The disclosure will now be summarized through the following example clauses:

Clause 1. A delay-line circuit for delaying an input clock signal, comprising:
a ring oscillator including a plurality of delay cells, the ring oscillator configured to produce oscillator output signals;
a clock edge sampler configured to generate data output signals, the clock edge sampler including a plurality of flip-flops corresponding to the plurality of delay cells on a one-to-one basis, each flip-flop being configured to latch the input clock signal responsive to an oscillator output signal from a corresponding delay cell to produce a corresponding data output signal; and
a delay output decoder configured to process the data output signals to select a first one of the oscillator output signals to form an output clock signal.

Clause 2. The delay-line circuit of clause 1, further comprising:
a calibration logic circuit configured to calibrate an oscillation frequency of the ring oscillator.

Clause 3. The delay-line circuit of clause 2, wherein the calibration logic circuit is configured to count responsive to cycles of a crystal oscillator signal to calibrate the oscillation frequency of the ring oscillator.

Clause 4. The delay-line circuit of any of clauses 1-3, wherein each flip-flop in the plurality of flip-flops comprises a data (D) type flip-flop.

Clause 5. The delay-line circuit of any of clauses 1-4, wherein the delay output decoder is configured to process three consecutive ones of the data output signals to identify a second one of the oscillator output signals as sampling a transition edge of the input clock signal, and wherein the first one of the oscillator output signals is delayed by an integer number of the oscillator output signals with respect to the second one of the oscillator output signals.

Clause 6. The delay-line circuit of clause 5, wherein the delay output decoder is further configured to process the three consecutive ones of the data output signals through an identification of whether at least two of the three consecutive data output signals have a same binary value.

Clause 7. The delay-line circuit of any of clauses 1-6, wherein the ring oscillator includes a plurality of n delay circuits, wherein n is a multiple of two, and wherein the plurality of flip-flops comprises a plurality of n flip-flops.

Clause 8. The delay-line circuit of clause 7, wherein n equals sixteen.

Clause 9. The delay-line circuit of clause 5, wherein the delay output decoder includes a clock voter circuit having a first logic gate configured to process a first data output signal and a second data output signal from the three consecutive data output signals, and having a second logic gate configured to process the second data output signal and a third data output signal from the three consecutive data output signals.

Clause 10. The delay-line circuit of clause 9, wherein the first logic gate comprises a first NAND gate, and wherein the second logic gate comprises a second NAND gate.

Clause 11. The delay-line circuit of clause 10, wherein the clock voter circuit further comprises:
a third NAND gate; and
an inverter configured to invert an output signal from the third NAND gate, and wherein the third NAND gate is configured to NAND an output signal from each of the first NAND gate, the second NAND gate, and the inverter.

Clause 12. A method, comprising:
generating a corresponding oscillator output signal in each delay cell in a plurality of delay cells arranged to form a ring oscillator;
sampling an input clock signal responsive to each oscillator output signal to form a plurality of data output signals;
processing the plurality of data output signals to identify a first one of the oscillator output signals as sampling an edge transition of the input clock signal; and
outputting a second one of the oscillator output signals as an output clock signal.

Clause 13. The method of clause 12, further comprising:
calibrating an oscillation frequency of the ring oscillator.

Clause 14. The method of clause 13, wherein calibrating the oscillation frequency of the ring oscillator comprises adjusting the oscillation frequency of the ring oscillator with respect to an oscillation frequency of a crystal oscillator signal.

Clause 15. The method of any of clauses 12-14, wherein processing the data output signals comprises identifying whether a trio of consecutive ones of the data output signals includes at least two data output signals having a binary one value.

Clause 16. A delay-line circuit, comprising:
a single ring oscillator configured to produce a plurality of oscillator output signals;
a clock edge sampler configured to sample an input clock signal according to the plurality of oscillator output signals to provide a plurality of data output signals; and a decoder configured to select one of the oscillator output signals as an output clock signal responsive to a processing of the plurality of data output signals.

Clause 17. The delay-line circuit of clause 16, further comprising:
a calibration logic circuit configured to calibrate an oscillation frequency of the single ring oscillator during an operation of the single ring oscillator.

Clause 18. The delay-line circuit of clause 17, wherein the calibration logic circuit is further configured to count responsive to a crystal oscillator signal to form a count and to calibrate the oscillation frequency responsive to the count.

Clause 19. The delay-line circuit of any of clauses 16-18, wherein the clock edge sampler comprises a plurality of flip-flops.

Clause 20. The delay-line circuit of clause 19, wherein the single ring oscillator comprises a plurality of delay circuits corresponding on a one-to-one basis with the plurality of flip-flops.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A delay-line circuit for delaying an input clock signal, comprising:
a ring oscillator including a plurality of delay cells, the ring oscillator configured to produce oscillator output signals;
a clock edge sampler configured to generate data output signals, the clock edge sampler including a plurality of flip-flops corresponding to the plurality of delay cells on a one-to-one basis, each flip-flop being configured to latch the input clock signal responsive to an oscillator output signal from a corresponding delay cell to produce a corresponding data output signal; and
a delay output decoder configured to process the data output signals to select a first one of the oscillator output signals to form an output clock signal.

2. The delay-line circuit of claim 1, further comprising:
a calibration logic circuit configured to calibrate an oscillation frequency of the ring oscillator.

3. The delay-line circuit of claim 2, wherein the calibration logic circuit is configured to count responsive to cycles of a crystal oscillator signal to calibrate the oscillation frequency of the ring oscillator.

4. The delay-line circuit of claim 1, wherein each flip-flop in the plurality of flip-flops comprises a data (D) type flip-flop.

5. The delay-line circuit of claim 1, wherein the delay output decoder is configured to process three consecutive ones of the data output signals to identify a second one of the oscillator output signals as sampling a transition edge of the input clock signal, and wherein the first one of the oscillator output signals is delayed by an integer number of the oscillator output signals with respect to the second one of the oscillator output signals.

6. The delay-line circuit of claim 5, wherein the delay output decoder is further configured to process the three consecutive ones of the data output signals through an identification of whether at least two of the three consecutive data output signals have a same binary value.

7. The delay-line circuit of claim 1, wherein the ring oscillator includes a plurality of n delay circuits, wherein n is a multiple of two, and wherein the plurality of flip-flops comprises a plurality of n flip-flops.

8. The delay-line circuit of claim 7, wherein n equals sixteen.

9. The delay-line circuit of claim 5, wherein the delay output decoder includes a clock voter circuit having a first logic gate configured to process a first data output signal and a second data output signal from the three consecutive data output signals and having a second logic gate configured to process the second data output signal and a third data output signal from the three consecutive data output signals.

10. The delay-line circuit of claim 9, wherein the first logic gate comprises a first NAND gate, and wherein the second logic gate comprises a second NAND gate.

11. The delay-line circuit of claim 10, wherein the clock voter circuit further comprises:
a third NAND gate; and
an inverter configured to invert an output signal from the third NAND gate, and wherein the third NAND gate is configured to NAND an output signal from each of the first NAND gate, the second NAND gate, and the inverter.

12. A method, comprising:
generating a corresponding oscillator output signal in each delay cell in a plurality of delay cells arranged to form a ring oscillator;
sampling an input clock signal responsive to each oscillator output signal to form a plurality of data output signals;
processing the plurality of data output signals to identify a first one of the oscillator output signals as sampling an edge transition of the input clock signal; and
outputting a second one of the oscillator output signals as an output clock signal.

13. The method of claim 12, further comprising:
calibrating an oscillation frequency of the ring oscillator.

14. The method of claim 13, wherein calibrating the oscillation frequency of the ring oscillator comprises adjusting the oscillation frequency of the ring oscillator with respect to an oscillation frequency of a crystal oscillator signal.

15. The method of claim 12, wherein processing the data output signals comprises identifying whether a trio of consecutive ones of the data output signals includes at least two data output signals having a binary one value.

16. A delay-line circuit, comprising:
a single ring oscillator configured to produce a plurality of oscillator output signals;
a clock edge sampler configured to sample an input clock signal according to the plurality of oscillator output signals to provide a plurality of data output signals; and
a decoder configured to select one of the oscillator output signals as an output clock signal responsive to a processing of the plurality of data output signals.

17. The delay-line circuit of claim 16, further comprising:
a calibration logic circuit configured to calibrate an oscillation frequency of the single ring oscillator during an operation of the single ring oscillator.

18. The delay-line circuit of claim 17, wherein the calibration logic circuit is further configured to count responsive to a crystal oscillator signal to form a count and to calibrate the oscillation frequency responsive to the count.

19. The delay-line circuit of claim 16, wherein the clock edge sampler comprises a plurality of flip-flops.

20. The delay-line circuit of claim 19, wherein the single ring oscillator comprises a plurality of delay circuits corresponding on a one-to-one basis with the plurality of flip-flops.

* * * * *